US010861990B2

(12) United States Patent
Torigoe et al.

(10) Patent No.: US 10,861,990 B2
(45) Date of Patent: Dec. 8, 2020

(54) EPITAXIAL SILICON WAFER

(71) Applicant: SUMCO CORPORATION, Tokyo (JP)

(72) Inventors: Kazuhisa Torigoe, Tokyo (JP); Toshiaki Ono, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 16/583,732

(22) Filed: Sep. 26, 2019

(65) Prior Publication Data

US 2020/0020817 A1 Jan. 16, 2020

Related U.S. Application Data

(63) Continuation of application No. 15/745,174, filed as application No. PCT/JP2016/069980 on Jul. 6, 2016, now abandoned.

(30) Foreign Application Priority Data

Jul. 28, 2015 (JP) .................................. 2015-148558

(51) Int. Cl.
*H01L 31/0288* (2006.01)
*C30B 29/06* (2006.01)
(Continued)

(52) U.S. Cl.
CPC ........ *H01L 31/0288* (2013.01); *C30B 15/203* (2013.01); *C30B 15/305* (2013.01);
(Continued)

(58) Field of Classification Search
CPC ............. H01L 31/0288; H01L 21/3225; H01L 27/14687; C30B 15/203; C30B 25/18; C30B 29/06; C30B 33/02
See application file for complete search history.

(56) References Cited

U.S. PATENT DOCUMENTS

| 5,951,755 A | 9/1999 | Miyashita et al. |
|---|---|---|
| 6,222,252 B1 | 4/2001 | Numano et al. |

(Continued)

FOREIGN PATENT DOCUMENTS

| JP | 2006-040972 A | 2/2006 |
|---|---|---|
| JP | 2007-145692 A | 6/2007 |

(Continued)

OTHER PUBLICATIONS

International Search Report issued in International Bureau of WIPO Patent Application No. PCT/JP2016/069980, dated Oct. 11, 2016.

(Continued)

*Primary Examiner* — Fernando L Toledo
*Assistant Examiner* — Neil R Prasad
(74) *Attorney, Agent, or Firm* — Greenblum & Bernstein, P.L.C.

(57) ABSTRACT

A method of manufacturing an epitaxial silicon wafer that includes growing a silicon single crystal ingot doped with a boron concentration of $2.7 \times 10^{17}$ atoms/cm$^3$ or more and $1.3 \times 10^{19}$ atoms/cm$^3$ or less by the CZ method; producing a silicon substrate by processing the silicon single crystal ingot; and forming an epitaxial layer on a surface of the silicon substrate. During growing of the silicon single crystal ingot, the pull-up conditions of the silicon single crystal ingot are controlled so that the boron concentration Y (atoms/cm$^3$) and an initial oxygen concentration X ($\times 10^{17}$ atoms/cm$^3$) satisfy the expression $X \leq -4.3 \times 10^{-19} Y + 16.3$.

2 Claims, 4 Drawing Sheets

(51) Int. Cl.
  *C30B 30/04* (2006.01)
  *C30B 15/30* (2006.01)
  *C30B 15/20* (2006.01)
  *C30B 25/18* (2006.01)
  *C30B 33/02* (2006.01)
  *H01L 21/322* (2006.01)
  *H01L 27/146* (2006.01)
  *H01L 21/02* (2006.01)

(52) U.S. Cl.
  CPC .............. *C30B 25/18* (2013.01); *C30B 29/06* (2013.01); *C30B 30/04* (2013.01); *C30B 33/02* (2013.01); *H01L 21/3225* (2013.01); *H01L 27/14687* (2013.01); *H01L 21/0262* (2013.01); *H01L 21/02381* (2013.01); *H01L 21/02532* (2013.01); *H01L 21/02664* (2013.01)

(56) References Cited

U.S. PATENT DOCUMENTS

| | | | |
|---|---|---|---|
| 6,548,886 B1* | 4/2003 | Ikari | ............... H01L 21/3225 257/610 |
| 2007/0089666 A1 | 4/2007 | Koike | |
| 2008/0038526 A1 | 2/2008 | Kume et al. | |
| 2008/0108207 A1 | 5/2008 | Koike | |
| 2008/0286565 A1 | 11/2008 | Koike et al. | |
| 2010/0151692 A1 | 6/2010 | Ono | |
| 2012/0043644 A1 | 2/2012 | Ono et al. | |
| 2012/0161219 A1 | 6/2012 | Okonogi | |
| 2014/0361408 A1* | 12/2014 | Falster | ................. H01L 21/223 257/607 |
| 2015/0171173 A1 | 6/2015 | Umeda et al. | |

FOREIGN PATENT DOCUMENTS

| | | |
|---|---|---|
| JP | 2008-115050 A | 5/2008 |
| JP | 2010-083712 A | 4/2010 |
| JP | 2010-228924 A | 10/2010 |
| JP | 2011-228459 A | 11/2011 |
| JP | 2012-138576 A | 7/2012 |
| WO | 2014/041736 | 3/2014 |

OTHER PUBLICATIONS

International Preliminary Report on Patentability issued in International Bureau of WIPO Patent Application No. PCT/JP2016/069980, dated Jan. 30, 2018.

Thurber et al., "The Relationship Between Resistivity and Dopant Density for Phosphorus- and Boron-Doped Silicon", NBS Special Publication 400-64, 1981, pp. 1-60.

Office Action for DE App. No. 11 2016 003 412.1 dated Apr. 23, 2020 (w/ translation).

* cited by examiner

EPITAXIAL SILICON WAFER

CROSS REFERENCE TO RELATED APPLICATIONS

This application is a Continuation of U.S. application Ser. No. 15/745,174, which is a National Stage of PCT/JP2016/069980, filed Jul. 6, 2016, which claims priority to JP App. No. 2015-148558, filed Jul. 28, 2015. Each of the above applications is incorporated by reference herein in its entirety.

TECHNICAL FIELD

The present invention relates to an epitaxial silicon wafer, and more particularly to an epitaxial silicon wafer having an epitaxial layer formed on the surface of a boron-doped p-type silicon substrate.

BACKGROUND ART

Epitaxial silicon wafers are being widely used as substrate material for semiconductor devices. An epitaxial silicon wafer has an epitaxial layer formed on the surface of a bulk silicon substrate. Since epitaxial silicon wafers show a high degree of crystal perfection, they can serve for manufacturing of highly reliable, high-quality semiconductor devices.

Silicon substrates containing a p-type or n-type impurity at high concentration are employed for epitaxial silicon wafers, whose applications include solid-state imaging elements and power semiconductor devices. For example, Patent Literature 1 describes an epitaxial silicon wafer comprising a wafer that shows a nitrogen concentration of $1 \times 10^{12}$ atoms/cm$^3$ or more or whose electrical resistivity is set to 20 mΩ·cm or less by means of boron-doping and an epitaxial layer arranged on the surface of the wafer, wherein the initial oxygen concentration of the epitaxial silicon wafer is $14 \times 10^{17}$ atoms/cm$^3$ or less.

If compared with ordinary wafers, silicon wafers that are heavily doped with nitrogen or boron can easily produce oxygen precipitates in device manufacturing processes because nitrogen and boron raise the stability of oxygen precipitation cores. Therefore, if laser spike annealing (LSA) is executed in a state where plate-shaped oxygen precipitates has grown to show a large size, dislocation can easily take place, starting from such an oxygen precipitation core. However, an epitaxial silicon wafer described above can prevent dislocation that starts from an oxygen precipitation core from taking place even when LSA is executed in the device fabrication process.

Patent Literature 2 describes an epitaxial wafer to be used for a backside illumination type solid-state imaging element, the epitaxial silicon wafer comprising a p-type silicon substrate containing carbon and nitrogen added thereto and having an electrical resistivity of less than 100 mΩ·cm, a p-type first epitaxial layer formed on the p-type silicon substrate and a p-type or n-type second epitaxial layer formed on the p-type first epitaxial layer, the interstitial oxygen concentration in the p-type silicon substrate being between $10 \times 10^{17}$ atoms/cm$^3$ and $20 \times 10^{17}$ atoms/cm$^3$, the density of precipitate in a central portion of the p-type silicon substrate as viewed in the depth direction thereof being $5 \times 10^5$ cm$^2$ or more and $5 \times 10^7$ cm$^2$ or less. According to this epitaxial wafer, Backside illumination type solid-state imaging elements can be manufactured at high yield.

CITATION LIST

Patent Literature

[Patent Literature 1] Japanese Patent Application Laid-Open No. 2011-228459
[Patent Literature 2] Japanese Patent Application Laid-Open No. 2012-138576

SUMMARY OF THE INVENTION

Problems to be Solved by the Invention

With regard to epitaxial wafers to be used for solid-state imaging elements and other applications, the boron contained in the silicon substrate is indispensable to secure the gettering ability and lower the electric resistance of the silicon substrate. However, on the other hand, when boron is diffused to a large extent from the silicon substrate toward the epitaxial layer side, there arises a problem that the impurity profile of the epitaxial layer is changed to degrade the uniformity of in-plane electrical resistivity of the wafer. Additionally, the width of the transition region of boron concentration (resistance-varying layer) in the epitaxial layer at and near the boundary of the silicon substrate and the epitaxial layer is increased to reduce the effective thickness of the epitaxial layer so as to in turn degrade the characteristics of the semiconductor device. For this reason, it is necessary to suppress boron diffusion in the silicon substrate as much as possible.

It is known that diffusion of boron atoms contained in a silicon substrate is enhanced as the silicon substrate is subjected to a heat treatment in an oxidizing atmosphere. As thermal oxide film is formed on the surface of a silicon substrate, some of the Si atoms in the silicon substrate are ousted from their places because their original places are occupied by SiO$_2$ molecules and then pushed out from the crystal lattice. Then, the number of interstitial silicon atoms increases. On the other hand, as boron atoms are replaced by interstitial silicon atoms, they are diffused by kick-out diffusion. Thus, the diffusion of boron atoms is enhanced as a result of the increase in the number of interstitial silicon atoms. Therefore, a technique of suppressing enhanced diffusion of boron atoms is to avoid as much as possible conducting any heat treatment in an oxidizing atmosphere.

However, there are instances where device characteristics are degraded due to boron diffusion even when the device fabrication process does not include any heat treatment in an oxidizing atmosphere. Therefore, it is eagerly desired to improve the existing techniques for suppressing enhanced diffusion of boron atoms.

Means for Solving the Problems

In view of the above identified technical problems, it is therefore an object of the present invention to provide an epitaxial silicon wafer in which enhanced boron diffusion in the silicon substrate is suppressed.

To solve the above problems, the inventors of the present invention intensively looked into the mechanism of boron diffusion in silicon wafers. As a result of the intensive research efforts, the inventors have made it clear that not only in heat treatments in an oxidizing atmosphere, but also in any heat treatments, interstitial silicon atoms are released as oxygen precipitates grows in the silicon substrate and kick-out diffusion of boron atoms is promoted by way of interstitial silicon atoms. In particular, boron diffusion attributable to oxygen precipitates rapidly progresses when the density of oxygen precipitates in the silicon substrate exceeds a threshold level. The present invention is achieved by the inventors of the present invention as they paid attention to this fact.

Thus, the present invention is based on the above-described technical findings. An epitaxial silicon wafer according to the present invention is characterized in that an epitaxial layer is formed on a surface of a boron-doped silicon substrate, wherein the boron concentration in the silicon substrate is $2.7 \times 10^{17}$ atoms/cm$^3$ or more and $1.3 \times 10^{19}$ atoms/cm$^3$ or less, an initial oxygen concentration in the silicon substrate is $11 \times 10^{17}$ atoms/cm$^3$ or less, and when an oxygen precipitate evaluation heat treatment is executed on the epitaxial silicon wafer, the density of oxygen precipitates in the silicon substrate is $1 \times 10^{10}$/cm$^3$ or less.

Thus, according to the present invention, the density of oxygen precipitates in the silicon substrate is $1 \times 10^{10}$/cm$^3$ or less and, therefore, even when oxygen precipitates in the silicon substrate grows as a result of any heat treatment in the device fabrication process, it is possible to suppress the increase in the number of interstitial silicon atoms that arises as a result of a rise of the density of oxygen precipitates. Then, it is also possible to suppress the kick-out diffusion of boron atoms in the silicon substrate toward the epitaxial layer side by way of the interstitial silicon atoms so that consequently diffusion of boron atoms can be suppressed to a level that is practically equal to the level of boron diffusion that is observed when the density of oxygen precipitates is substantially nil.

In the present invention, the boron concentration in the silicon substrate is preferably $2.7 \times 10^{17}$ atoms/cm$^3$ or more and $1.3 \times 10^{19}$ atoms/cm$^3$ or less and the initial oxygen concentration in the silicon substrate is preferably $11 \times 10^{17}$ atoms/cm$^3$ or less. When the initial oxygen concentration in the silicon substrate is $11 \times 10^{17}$ atoms/cm$^3$ or less, the density of oxygen precipitates in the silicon substrate can be held to $1 \times 10^{10}$/cm$^3$ or less even when oxygen precipitates in the silicon substrate grows due to any heat treatment in the device fabrication process.

In the present invention, the boron concentration Y (atoms/cm$^3$) and the initial oxygen concentration X ($\times 10^{17}$ atoms/cm$^3$) preferably satisfy a relational expression of $X \leq -4.3 \times 10^{-19} Y + 16.3$. So long as the boron concentration and the initial oxygen concentration in the silicon substrate satisfy the above defined requirement, the density of oxygen precipitates can be held to $1 \times 10^{10}$/cm$^3$ or less regardless of the boron concentration in the silicon substrate. Then, therefore, it is possible to suppress enhanced boron diffusion attributable to oxygen precipitates.

Advantages of the Invention

Thus, as described above, the present invention can provide an epitaxial silicon wafer that can suppress enhanced boron diffusion in the silicon substrate even when oxygen precipitates grow due to any heat treatment in the device fabrication process.

DETAILED DESCRIPTION OF THE EMBODIMENTS

Preferred embodiments of the present invention will now be described in detail with reference to the accompanying drawings.

Figure 1:
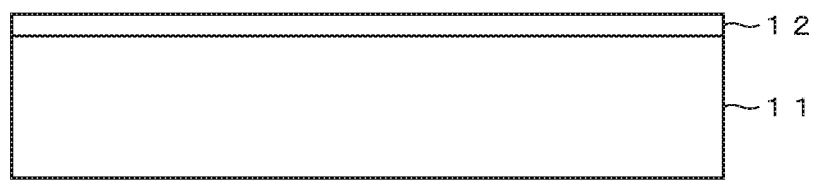
FIG. 1 is a schematic cross-sectional view illustrating a structure of an epitaxial silicon wafer according to an embodiment of the present invention.

FIG. 1 is a schematic cross-sectional view illustrating a structure of an epitaxial silicon wafer according to an embodiment of the present invention.

As shown in FIG. 1, an epitaxial silicon wafer 10 of this embodiment comprises a silicon substrate 11 and an epitaxial layer 12 formed on the surface of the silicon substrate 11. The silicon substrate 11 is a polished wafer that is cut out from a silicon monocrystalline ingot grown by means of the Czochralski method (CZ method) and has a mirror-polished surface. The silicon substrate 11 takes a role of securing mechanical strength of the epitaxial silicon wafer 10 and, at the same time, operating as gettering sink for capturing heavy metals. While the thickness of the silicon substrate 11 is not specifically defined so long as it can secure mechanical strength of the epitaxial silicon wafer 10, it may typically be made to be equal to 725 mm.

The silicon substrate 11 is a boron-doped p-type silicon substrate. The boron concentration in the silicon substrate 11 is preferably $2.7 \times 10^{17}$ atoms/cm$^3$ or more and $1.3 \times 10^{19}$ atoms/cm$^3$ or less while the electrical resistivity of the silicon substrate 11 is preferably 20 mΩ·cm or less. The electrical resistivity of the silicon substrate 11 can be reduced to such a low level and the silicon substrate 11 can be provided with a sufficiently high gettering ability by using a silicon substrate 11 that is doped with boron to such a high concentration level.

An epitaxial layer 12 is formed on the surface of the silicon substrate 11. A semiconductor device such as a MOS transistor may typically be formed in the epitaxial layer 12. The thickness of the epitaxial layer 12 is preferably between 1 and 10 μm. The epitaxial layer 12 may have a multilayer structure formed by laying a plurality of epitaxial layers having different characteristics one on the other. Normally, the electrical resistivity of the epitaxial layer 12 is made to be higher than the electrical resistivity of the silicon substrate 11 and the silicon substrate is made to contain a p-type dopant (boron) or an n-type dopant (phosphor, arsenic or antimony) added thereto.

When an oxygen precipitate evaluation heat treatment is executed on the epitaxial silicon wafer 10, the density of oxygen precipitates in the silicon substrate 11 is $1 \times 10^{10}$/cm$^3$ or less. As will be described in greater detail hereinafter, the oxygen precipitates in the silicon substrate 11 will only minimally influence the boron diffusion when the density of oxygen precipitates is $1 \times 10^{10}$/cm$^3$ or less. Then, the boron diffusion can be held to a level that is practically equal to the diffusion level that is observed when the density of oxygen precipitates is substantially nil.

An oxygen precipitate evaluation heat treatment is a two-step heat treatment in which typically a first heat treatment (core forming step) and a second heat treatment (core growing step) are sequentially conducted respectively at 700° C. for 3 hours and at 1,000° C. for 16 hours. They are heat treatments simulating those of a device fabrication process. The heat treatments are conducted not in an oxidizing atmosphere but in a nitrogen atmosphere so that no thermal oxide film is formed there and hence there arises no problem of enhanced diffusion of boron atoms attributable to production of thermal oxide film. However, as the oxygen precipitation core grows in the silicon substrate 11, the density of oxygen precipitates rises to give rise to an additional cause of boron diffusion. Furthermore, it is known that boron in the silicon substrate 11 exerts an effect of promoting oxygen precipitation and therefore, as the boron concentration in the silicon substrate 11 rises, the density of oxygen precipitates in the silicon substrate 11 also rises. While the existence of oxygen precipitates is necessary to some extent for the purpose of securing the gettering ability, enhanced boron diffusion occurs as the volume of oxygen precipitate increases.

To make the density of oxygen precipitate in the silicon substrate 11 $1 \times 10^{10}/cm^3$ or less, it is necessary to make the interstitial initial oxygen concentration of the silicon substrate 11 $11 \times 10^{17}$ atoms/$cm^3$ or less. If the initial oxygen concentration is higher than $11 \times 10^{17}$ atoms/$cm^3$, the number of interstitial silicon atoms rises as the density of oxygen precipitate increases to consequently allow enhanced boron diffusion to occur by way of interstitial silicon atoms. The lower the initial oxygen density, the better for the density of oxygen precipitate to be held below the above defined limit level. While no lower limit is defined for the initial oxygen concentration, it is currently impossible to grow silicon single crystals having an initial oxygen concentration lower than $11 \times 10^{17}$ atoms/$cm^3$ from the viewpoint of actual manufacturing. Note here that all the oxygen concentrations cited in this patent specification are measured values obtained by means of Fourier transform infrared spectrometry (FT-IR) as defined in ASTM F-121 (1979).

The preferred range of initial oxygen concentration in the silicon substrate 11 changes as a function of the boron concentration in the substrate. When the boron concentration in the silicon substrate 11 is low, no problem arises if the initial oxygen concentration is high to some extent. However, when the boron concentration is high, oxygen precipitate is produced excessively unless the initial oxygen concentration is held low because oxygen precipitate can easily grow in such an environment so that it may not be possible to make the density of oxygen precipitate $1 \times 10^{10}/cm^3$ or less. When the initial oxygen concentration in the silicon substrate 11 is expressed by X ($\times 10^{17}$ atoms/$cm^3$) and the boron concentration is expressed by Y (atoms/$cm^3$), they preferably satisfy the requirement of the relational expression of $X \leq -4.3 \times 10^{-19}Y + 16.3$. As long as they satisfy the requirement of the above defined relational expression, the density of oxygen precipitate in the silicon substrate 11 can be held to be $1 \times 10^{10}/cm^3$ or less regardless of the boron concentration.

Figure 2:
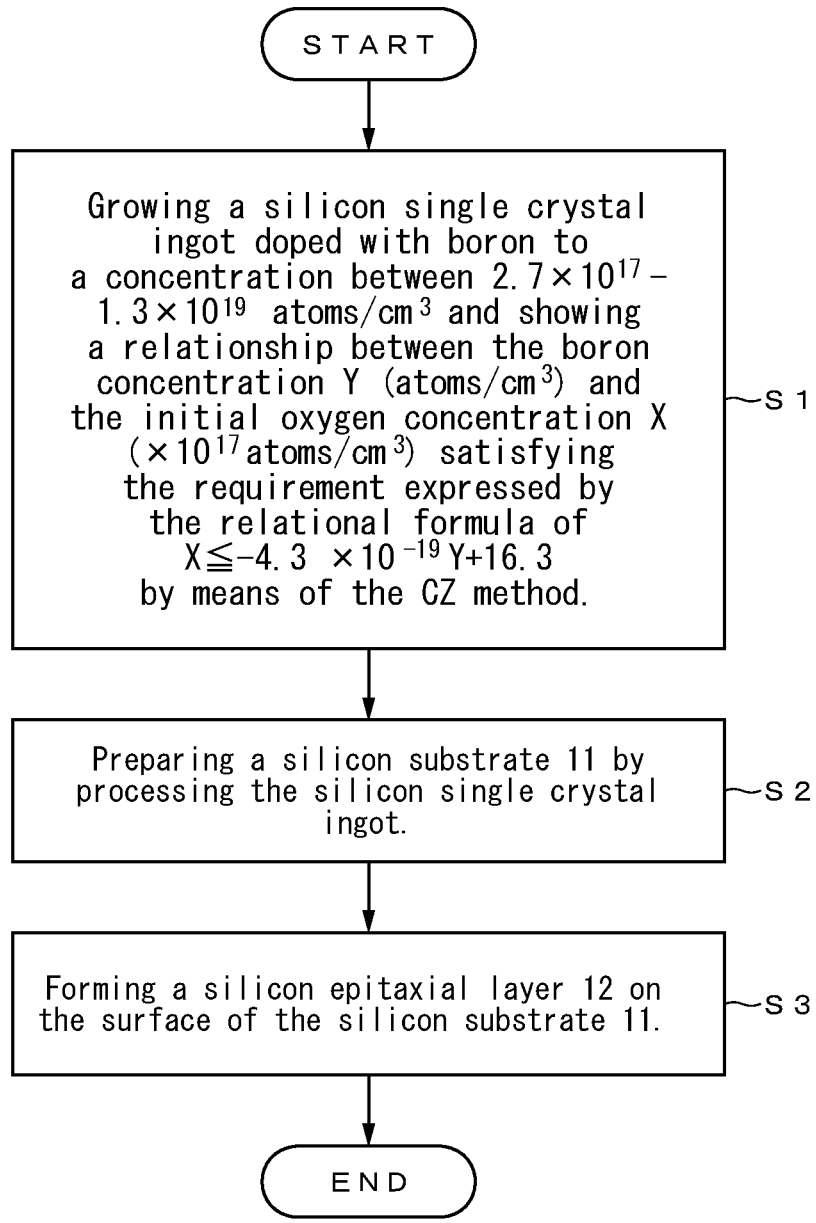
FIG. 2 is a flowchart illustrating a process of manufacturing the epitaxial silicon wafer.

FIG. 2 is a flowchart illustrating a process of manufacturing the epitaxial silicon wafer 10.

As shown in FIG. 2, to manufacture the epitaxial silicon wafer 10, firstly a boron-doped silicon single crystal ingot is made to grow by way of the Cz process (Step S1). In this step, the silicon single crystal is doped with boron to a concentration level between $2.7 \times 10^{17}$ atoms/$cm^3$ and $1.3 \times 10^{19}$ atoms/$cm^3$. Although the silicon single crystal contains oxygen to the level of super saturation because oxygen is eluted from the quartz crucible that is being employed for the manufacturing process, the oxygen concentration in the silicon single crystal can be controlled by controlling the single crystal pull-up conditions. More specifically, the single crystal pull-up conditions are controlled such that the initial oxygen concentration X ($\times 10^{17}$ atoms/$cm^3$) and the boron concentration Y (atoms/$cm^3$) in the silicon single crystal satisfy the above-described requirement of the relational expression of $X \leq -4.3 \times 10^{-19}Y + 16.3$.

When silicon is put into a quartz crucible as starting material, a predetermined amount of boron is added to the raw material so as to make the single crystal pulled up from the quartz crucible contain boron. More specifically, boron is added by the amount that makes the single crystal show the intended electrical resistivity at the top position of the single crystal. Then, as the added boron is molten with the starting material of silicon, boron-containing silicon melt is produced. While the single crystal that is pulled up from the silicon melt contains boron at a given content ratio, the boron concentration rises in the ingot pull-up direction as the crystal growth progresses due to segregation. Therefore, the oxygen concentration needs to be reduced in the ingot pull-up direction so as to make the ingot satisfy the requirement of the above defined relational expression.

The oxygen concentration in the single crystal can be controlled by adjusting the rotational speed of the quartz crucible and/or the power supplied to the heater. To reduce the oxygen concentration in the single crystal, it is sufficient to select a low rotational speed for the quartz crucible and/or a low power output for the heater. Thus, the oxygen concentration in the single crystal can be held low by controlling the conditions under which the single crystal is pulled up in the above-described manner.

The MCZ method of pulling up the single crystal, while applying a magnetic field to the silicon melt, is very effective for reducing the oxygen concentration in the pulled up single crystal. With the MCZ method, the convection of the silicon melt can be suppressed under the influence of the magnetic field so that consequently the elution of oxygen from the quartz crucible into the silicon melt can be suppressed and hence the oxygen concentration in the single crystal that is pulled up from the silicon melt can also be held to a low level.

Then, the silicon single crystal ingot is processed to produce the silicon substrate 11 (Step S2). As described above, the silicon substrate 11 is a polished wafer that is cut out from the silicon single crystal ingot and whose surface is mirror-polished. The boron concentration of the silicon substrate 11 is $2.7 \times 10^{17}$ atoms/$cm^3$ or more and $1.3 \times 10^{19}$ atoms/$cm^3$ or less and the initial oxygen concentration in the silicon substrate 11 is $11 \times 10^{17}$ atoms/$cm^3$ or less.

Next, an epitaxial layer 12 is formed on the surface of the silicon substrate 11 by a well-known method (Step S3). As a result of executing the above steps, a finished epitaxial wafer 10 is produced.

An epitaxial silicon wafer 10 that is manufactured in the above-described way is then employed as substrate material for semiconductor devices. Then, various semiconductor devices can be produced by using such an epitaxial silicon wafer by way of various processing steps. Such processing steps include various heat treatment steps and, as a result, an oxygen precipitation core is formed in the silicon substrate 11, which oxygen precipitation core grows to increase the density of oxygen precipitate in the silicon substrate. However, since the density of oxygen precipitate in the silicon substrate is held to be $1 \times 10^{10}/cm^3$ or less, any enhanced boron diffusion attributable to oxygen precipitate can be prevented from taking place.

If the boron concentration and the initial oxygen concentration in the silicon substrate are known and the heat treatment conditions (heat history) in the device fabrication process are also known, the density of oxygen precipitate and the extent of enhanced boron diffusion in the silicon substrate that will be observed when such an epitaxial silicon wafer is heat treated during the device fabrication process can be predicted by means of simulation. If, as a result of such simulation, the width of the transition region that is broadened by enhanced boron diffusion cannot be confined within the given permissible range, it may only be necessary to adjust the initial oxygen concentration so as to confine the width of the transition region within the given permissible range. Thus, the initial oxygen concentration in the silicon substrate that is necessary to produce a given density of oxygen precipitate can be predicted from the heat treatment conditions in the device fabrication process, so that the enhanced boron diffusion can be confined within a given permissible range.

As described above in detail, the epitaxial silicon wafer 10 of this embodiment comprises a boron-doped silicon substrate 11 and an epitaxial layer 12 formed on the surface of the silicon substrate 11 and, when an oxygen precipitate evaluation heat treatment is conducted, the density of oxygen precipitates in the silicon substrate 11 is found to be $1\times10^{10}/cm^3$ or less. Thus, this embodiment can suppress any enhanced diffusion of boron that can take place from the silicon substrate 11 toward the epitaxial layer 12 as a result of a rise in the density of oxygen precipitates.

The epitaxial silicon wafer 10 of this embodiment can advantageously be employed as substrate material for a backside illumination type solid-state imaging element. In the process of manufacturing a backside illumination type solid-state imaging element, metal impurities contained in the silicon substrate can increase the dark current of the sensor section to in turn give rise to defects that are referred to as white flaws. However, the use of a p-type silicon substrate that is doped with boron atoms to a high concentration level can solve the problem of metal impurities because the silicon substrate operates as gettering sink.

Additionally, in a backside illumination type solid-state imaging element, the wiring layer and related parts are arranged in layers located lower than the sensor section so that the sensor section can directly take in light coming from outside. Then, as a result, the imaging element can produce clear images including moving images. It is necessary to execute a process of removing the silicon substrate 11 typically by polishing in order to arrange the wiring layer and related parts in layers located lower than the sensor section and causing only the epitaxial layer 12 to be left undamaged. If the transition region in the epitaxial layer 12 is broadened by enhanced boron diffusion to degrade the uniformity of in-plane electrical resistivity of the wafer, it becomes difficult to determine the appropriate extent to which the silicon substrate 11 is to be polished and, additionally, the characteristics of the solid-state imaging element can be degraded because the effective thickness of the epitaxial layer 12 can be reduced. However, the above identified problems will be dissolved to make it possible to manufacture a high quality backside illumination type imaging element when the width of the transition region is satisfactorily narrow and the effective thickness of the epitaxial layer 12 is sufficiently large.

While preferred embodiments of the present invention have been explained above, the present invention is not limited thereto. Various modifications can be made to the embodiments without departing from the scope of the present invention and it is needless to say that such modifications are also embraced within the scope of the invention.

EXAMPLES

A silicon substrate with (100) crystal plane orientation was cut out from a silicon single crystal ingot grown by means of the CZ method and the surface of the silicon substrate was mirror-polished. The silicon substrate contained boron added thereto to a concentration of $1.0\times10^{19}$ atoms/cm$^3$. The initial oxygen concentration of the silicon substrate was $6\times10^{17}$ atoms/cm$^3$. An epitaxial layer of 5 μm thickness was formed on the surface of the silicon substrate by vapor deposition at a temperature of 1150° C. to obtain a sample of epitaxial silicon wafer, which will be referred to as epitaxial silicon wafer Sample #1 hereinafter. Additionally, epitaxial silicon wafer samples of Samples #2 through #4, which showed respective initial oxygen concentrations that differed from the initial oxygen concentration of Sample #1, were prepared by way of respective processes similar to the process of preparing Sample #1. The initial oxygen concentration of Sample #2, that of Sample #3 and that of Sample #4 were respectively $10\times10^{17}$ atoms/cm$^3$, $11\times10^{17}$ atoms/cm$^3$ and $13\times10^{17}$ atoms/cm$^3$.

Then, an oxygen precipitate evaluation heat treatment was conducted on each of the epitaxial silicon wafer samples #1 through #4. In each of the oxygen precipitate evaluation heat treatments, a heat treatment was conducted at 700° C. in a nitrogen atmosphere for 3 hours and subsequently another heat treatment was conducted at 1,000° C. also in an nitrogen atmosphere for 16 hours. Additionally, depth profiling of boron concentration of each of the samples #1 through #4 was observed by SIMS (secondary ion mass spectroscopy) before and after the oxygen precipitate evaluation heat treatment.

Figure 3:
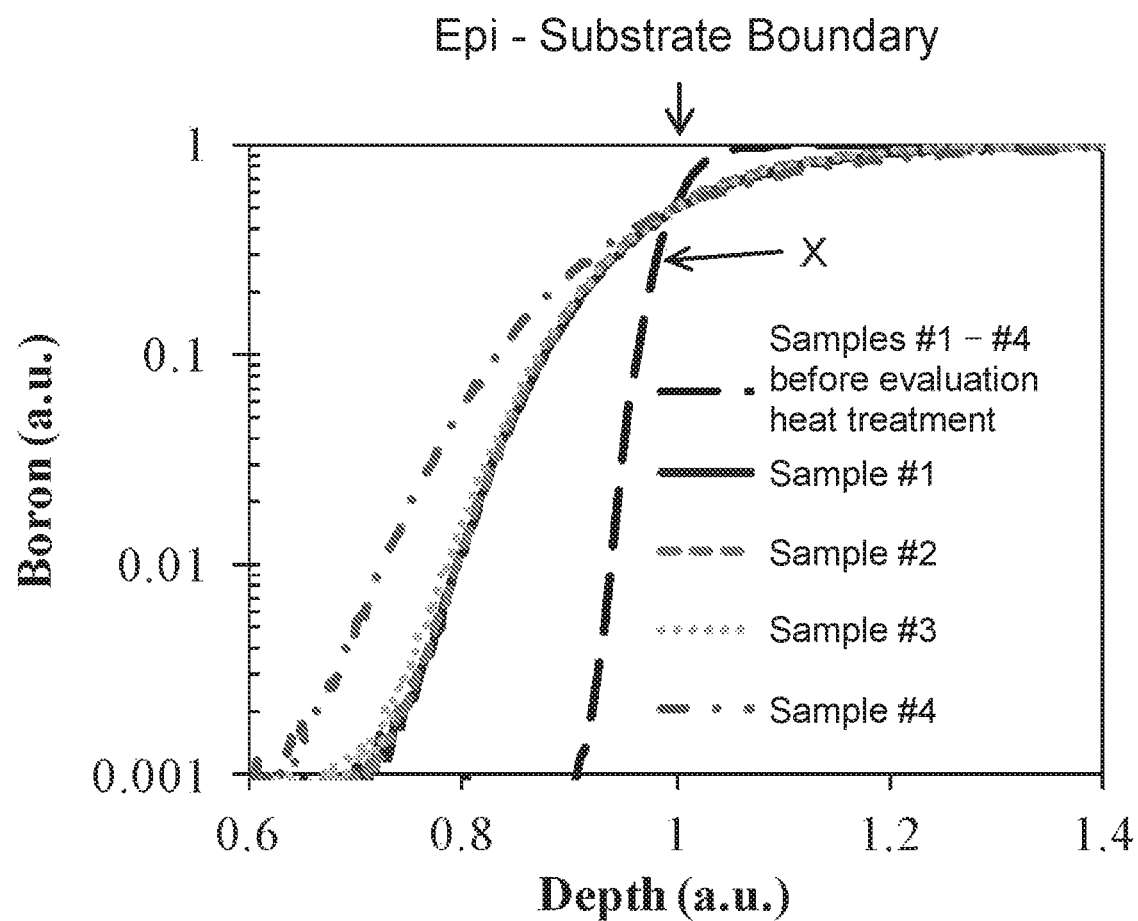
FIG. 3 is a graph illustrating the depth profiling of boron concentration of each of the epitaxial silicon wafer samples #1 through #4 before and after the oxygen precipitate evaluation heat treatment.

FIG. 3 is a graph illustrating the depth profiling of boron concentration of each of the epitaxial silicon wafer samples #1 through #4 before and after the oxygen precipitate evaluation heat treatment. The horizontal axis of the graph indicates the depth (relative value) from the uppermost surface of the wafer and the vertical axis of the graph indicates the boron concentration (relative value).

As shown in FIG. 3, all of the epitaxial silicon wafer samples #1 through #4 before the oxygen precipitate evaluation heat treatments showed boron concentration profiles that are substantially the same with each other. Each of them showed an abrupt change at and near the boundary of the silicon substrate and the epitaxial layer to prove that the amount of boron that diffused into the epitaxial layer there was very small. The broken line X having long segments commonly shows the boron concentration profiles of the samples #1 through #4 before the oxygen precipitate evaluation heat treatments.

On the other hand, all the boron concentration profiles of the samples #1 through #4 changed remarkably after the respective oxygen precipitate evaluation heat treatments if compared with the concentration profiles that were observed before the evaluation heat treatments. More specifically, the boron diffusion into the epitaxial layer increased to a large extent after the oxygen precipitate evaluation heat treatment in each of the samples. Thus, it may be safe to assume that the thermal diffusion due to the evaluation heat treatment is mainly responsible for the remarkable change in the boron concentration profile of each of the samples.

Out of the samples, the boron concentration profile (solid line) of "Sample #1" showed that practically no boron atoms existed at and near the surface of the epitaxial layer. In other words, Sample #1 showed an excellent result. The boron concentration abruptly increased at about depth 0.7. The boron concentration was 0.015 at depth 0.8, 0.2 at depth 0.9 and 0.5 at depth 1. Both "Sample #2" (broken line having short segments) and "Sample #3" (dotted line) showed respective boron concentration profiles that were substantially the same as that of Sample #1.

The boron concentration profile (dashed dotted line) of "Sample #4" largely differed from the boron concentration profiles of Samples #1 through #3". Boron diffusion progressed to near the surface of the epitaxial layer in Sample #4. More specifically, the boron concentration started to increase at about depth 0.6 and the boron concentrations at depth 0.7, at depth 0.8 and at depth 0.9 were respectively 0.004, 0.07 and 0.25. The boron concentration at depth 1 was 0.5, which was the same as the boron concentration at depth 1 of each of Samples #1 through #3.

From the obtained results as described above it became clear that boron diffusion was scarcely observed in Samples #1 through #3 but boron diffused very remarkably in Sample #4. It may be safe to assume that enhanced boron diffusion was mainly responsible for the phenomenon that the boron concentration profile of Sample #4 changed particularly remarkably.

Then, after the oxygen precipitate evaluation heat treatment, each of the epitaxial silicon wafer samples #1 through #4 were cleaved in the thickness direction and the cleaved cross-section of each of them was subjected to a selective etching process of etching it to a thickness of 2 µm by means of a wright etching solution. Subsequently, the central part of the cleaved cross-section in the thickness direction of the silicon wafer was observed through an optical microscope and the number of etch pits within the 100 µm×100 µm square area was measured as density of oxygen precipitates. Table 1 below shows the obtained results.

TABLE 1

| Wafer sample | Initial oxygen concentration (atoms/cm$^3$) | Boron concentration (atoms/cm$^3$) | Density of oxygen precipitates (/cm$^3$) |
|---|---|---|---|
| #1 | 6 × 10$^{17}$ | 1.0 × 10$^{19}$ | <1 × 10$^7$ |
| #2 | 10 × 10$^{17}$ | 1.0 × 10$^{19}$ | 1 × 10$^9$ |
| #3 | 11 × 10$^{17}$ | 1.0 × 10$^{19}$ | 1 × 10$^{10}$ |
| #4 | 13 × 10$^{17}$ | 1.0 × 10$^{19}$ | 3 × 10$^{10}$ |

As seen from Table 1, the density of oxygen precipitates of Sample #1 was below the measurement threshold (less than 1×10$^7$/cm$^3$). The density of oxygen precipitates of Sample #2 and that of Sample #3 were respectively 1×10$^9$/cm$^3$ and 1×10$^{10}$/cm$^3$, whereas that of Sample #4 was 3×10$^{10}$/cm$^3$. From the results shown in Table 1 and the graph of FIG. 3, it became clear that enhanced boron diffusion was scarcely observed in each of Samples #1 through #3, whose density of oxygen precipitates was 1×10$^{10}$/cm$^3$ or less.

Thereafter, a total of 28 samples of epitaxial silicon wafer that were differentiated by using the initial oxygen concentration and the boron concentration in the silicon substrate as parameters were prepared in order to look into the mutual relationship among the initial oxygen concentration, the boron concentration and the density of oxygen precipitates and each of the samples was subjected to an oxygen precipitate evaluation heat treatment and subsequently the density of oxygen precipitates thereof was measured.

Figure 4:
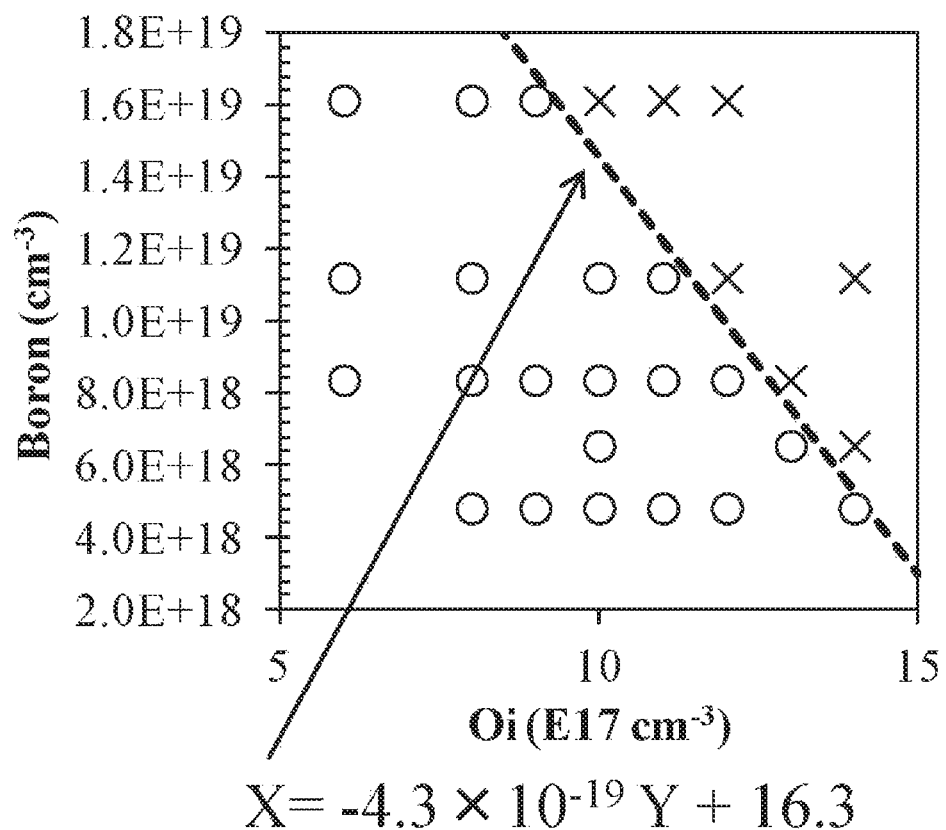
FIG. 4 is a graph illustrating the relationship among the density of oxygen precipitates, the initial oxygen concentration and the boron concentration.

FIG. 4 is a graph illustrating the relationship among the density of oxygen precipitates, the initial oxygen concentration and the boron concentration. The horizontal axis of the graph indicates the oxygen concentration (×10$^{17}$ atoms/cm$^3$) and the vertical axis indicates the boron concentration (atoms/cm$^3$). A "○" mark was plotted for a sample showing a density of oxygen precipitates that was 1×10$^{10}$/cm$^3$ or less, whereas a "×" mark was plotted for a sample showing a density of oxygen precipitates that was more than 1×10$^{10}$/cm$^3$.

As clearly seen from FIG. 4, it was found that the requirement of density of oxygen precipitates of 1×10$^{10}$/cm$^3$ or less cannot be met unless the initial oxygen concentration is made low when the boron concentration is high. For example, when the boron concentration was as low as 4.8×10$^{18}$ atoms/cm$^3$, the highest value of the initial oxygen concentration that could meet the requirement of density of oxygen precipitates of 1×10$^{10}$/cm$^3$ or less was about 14×10$^{17}$ atoms/cm$^3$. When, on the other hand, the boron concentration was as high as 1.6×10$^{19}$ atoms/cm$^3$, the highest value of the initial oxygen concentration that could meet the requirement of density of oxygen precipitates of 1×10$^{10}$/cm$^3$ or less was about 9×10$^{17}$ atoms/cm$^3$.

The boundary line separating the plotted "○" marks and the plotted "×" marks was expressed by means of a linear function to define the region of the plotted "○" marks. From the obtained results as described above, it became clear that the density of oxygen precipitates can be made to be 1×10$^{10}$/cm$^3$ or less when the oxygen concentration X (×10$^{18}$ atoms/cm$^3$) and the boron concentration Y (atoms/cm$^3$) satisfy the requirement of $X \leq -4.3 \times 10^{-19} Y + 16.3$.

REFERENCE SIGNS LIST

10 epitaxial silicon wafer
11 silicon substrate
12 epitaxial layer

What is claimed is:

1. A method of manufacturing an epitaxial silicon wafer in which an epitaxial silicon layer is formed on a surface of a boron-doped silicon substrate, the method comprising:
    growing a silicon single crystal ingot doped with a boron concentration of 2.7×10$^{17}$ atoms/cm$^3$ or more and 1.3×10$^{19}$ atoms/cm$^3$ or less by the CZ method;
    producing a silicon substrate by processing the silicon single crystal ingot; and
    forming an epitaxial silicon layer on a surface of the silicon substrate,
    wherein:
    growing the silicon single crystal ingot comprises controlling pull-up conditions of the silicon single crystal ingot so that the boron concentration Y (atoms/cm$^3$) and an initial oxygen concentration X (×10$^{17}$ atoms/cm$^3$) satisfy a relational expression of $X \leq -4.3 \times 10^{-19} Y + 16.3$.

2. The method of claim 1, wherein the growing the silicon single crystal ingot further comprises controlling the pull-up conditions of the silicon single crystal ingot so that the initial oxygen concentration X decreases in the pulling length direction in accordance with the boron concentration that increases in the pulling length direction as crystal growth progresses.

* * * * *